(12) United States Patent
Deak et al.

(10) Patent No.: US 11,536,779 B2
(45) Date of Patent: Dec. 27, 2022

(54) MAGNETORESISTIVE Z-AXIS GRADIENT SENSOR CHIP

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 0 days.

(21) Appl. No.: 15/315,329

(22) PCT Filed: May 14, 2015

(86) PCT No.: PCT/CN2015/078926
§ 371 (c)(1),
(2) Date: Nov. 30, 2016

(87) PCT Pub. No.: WO2015/180568
PCT Pub. Date: Dec. 3, 2015

(65) Prior Publication Data
US 2017/0205473 A1    Jul. 20, 2017

(30) Foreign Application Priority Data
May 30, 2014 (CN) .......................... 201410238418.6

(51) Int. Cl.
*G01R 33/022* (2006.01)
*G01R 33/09* (2006.01)
*G01R 33/00* (2006.01)

(52) U.S. Cl.
CPC ........ *G01R 33/022* (2013.01); *G01R 33/0011* (2013.01); *G01R 33/09* (2013.01)

(58) Field of Classification Search
CPC ...... G01R 33/06; G01R 33/09; G01R 33/091; G01R 33/093; G01R 33/095;
(Continued)

(56) References Cited

U.S. PATENT DOCUMENTS 5,508,611 A * 4/1996 Schroeder ................ F02P 7/07
174/545
2005/0007105 A1 * 1/2005 Siegle .................... G01D 5/145
324/207.25
(Continued)

FOREIGN PATENT DOCUMENTS

CN     102419393 A  *  4/2012  ............. G01R 19/32
CN     102590768 A  *  7/2012  ............. G01R 33/09
(Continued)

OTHER PUBLICATIONS

"International Application No. PCT/CN2015/078926, International Search Report and Written Opinion dated Aug. 21, 2015", (Aug. 21, 2015), 9 pgs.

*Primary Examiner* — David M Schindler
(74) *Attorney, Agent, or Firm* — Schwegman Lundberg & Woessner, P.A,

(57) ABSTRACT

A magnetoresistive Z-axis gradient sensor chip, which is used to detect the gradient in the XY plane of a Z-axis magnetic field component generated by a magnetic medium; the sensor chip comprises a Si substrate, a collection of two or two groups of flux guide devices separated a distance Lg and an arrangement of electrically interconnected magnetoresistive sensor units. The magnetoresistive sensor units are located on the Si substrate and located above or below the edge of the flux guide devices as well; the flux guide devices convert the component of the Z-axis magnetic field into the direction parallel to the surface of the Si substrate along the sensing axis direction of the magnetoresistive sensing units. The magnetoresistive sensor units are electrically interconnected into a half bridge or a full bridge gradiometer arrangement, wherein the opposite bridge arms are separated by distance Lg. This sensor chip can be utilized with a PCB or in combination with a PCB plus back-bias magnet with casing. The sensor measures the Z-axis mag-
(Continued)

netic field gradient by using magnetoresistive sensors with in-plane sensing axes. This sensor chip has several advantages relative to a Hall Effect sensor device, including smaller size, lower power consumption, and higher magnetic field sensitivity.

13 Claims, 6 Drawing Sheets

(58) Field of Classification Search
CPC .. G01R 33/096; G01R 33/098; G01R 33/022; G01R 33/0011; H01L 43/00; H01L 43/08
See application file for complete search history.

(56) References Cited

U.S. PATENT DOCUMENTS

| | | | | |
|---|---|---|---|---|
| 2011/0074406 A1* | 3/2011 | Mather | ............... | B82Y 25/00 |
| | | | | 324/252 |
| 2012/0200292 A1* | 8/2012 | Sugihara | ............... | B82Y 25/00 |
| | | | | 324/252 |
| 2012/0262164 A1* | 10/2012 | Bartos | ............... | G01R 33/09 |
| | | | | 324/252 |
| 2013/0176022 A1* | 7/2013 | Lee | ............... | G01R 33/096 |
| | | | | 324/252 |
| 2013/0241545 A1* | 9/2013 | Obana | ............... | G01R 33/093 |
| | | | | 324/252 |
| 2014/0327437 A1* | 11/2014 | Han | ............... | G01R 17/10 |
| | | | | 324/252 |
| 2015/0130455 A1* | 5/2015 | Bai | ............... | G01R 33/09 |
| | | | | 324/252 |
| 2016/0313409 A1* | 10/2016 | Endo | ............... | G01R 33/09 |
| 2017/0176545 A1* | 6/2017 | Deak | ............... | G01R 33/0206 |

FOREIGN PATENT DOCUMENTS

| | | | |
|---|---|---|---|
| CN | 203133257 | | 8/2013 |
| CN | 203480009 | | 3/2014 |
| CN | 203480009 U | * | 3/2014 |
| CN | 103901363 | | 7/2014 |
| CN | 103913709 | | 7/2014 |
| CN | 103954920 | | 7/2014 |
| CN | 103995240 | | 8/2014 |
| CN | 203894395 | | 10/2014 |
| EP | 1348974 | | 10/2003 |
| JP | 2012127788 A | * | 7/2012 |
| WO | WO-2009156697 | | 12/2009 |
| WO | WO-2015180568 | | 12/2015 |

* cited by examiner

MAGNETORESISTIVE Z-AXIS GRADIENT SENSOR CHIP

PRIORITY CLAIM TO RELATED APPLICATIONS

This application is a U.S. national stage application filed under 35 U.S.C. § 371 from International Application Serial No. PCT/CN2015/078926, which was filed 14 May 2015, and published as WO2015/180568 on 3 Dec. 2015, and which claims priority to Chinese Application No. 201410238418.6, filed 30 May 2014, which applications and publication are incorporated by reference as if reproduced herein and made a part hereof in their entirety, and the benefit of priority of each of which is claimed herein.

TECHNICAL FIELD

The present invention relates to the field of magnetic sensors, and in particular, to a magneto-resistive Z-axis gradient sensor chip.

BACKGROUND ART

Magnetoresistive gradient sensors are widely applied to gear tooth sensing and magnetic image sensors used in as POS machine magnetic heads and currency detector magnetic heads. Under normal circumstances, magnetoresistive sensors, for example, GMR and TMR sensors, have in-plane sensing axes, whereby the magnetic field sensing direction is parallel to the surface of the chip in which the sensors are located, while a Hall Effect sensor has a Z-axis sensing direction perpendicular to the surface of the chip. At present, when used in a magnetic image sensor, a Hall Effect sensor head usually has a Hall Effect sensor made of Murata's InSb thin film material, which measures a Z-axis magnetic field component. However, both the Hall sensor that measures a Z-axis magnetic field component and a GMR or TMR sensor that measures an in-plane magnetic field component have some problems:

1) As InSb is not a standard material and a non-standard semiconductor manufacturing process is employed, the manufacturing process thereof is more complex with respect to the standard semiconductor manufacturing process of sensors such as TMR and GMR.

2) At present, all GMR-based and TMR-based magnetic image sensors are mainly based on the in-plane magnetic field sensing direction, and when they are applied to currency detector magnetic heads, it is necessary to use a back-bias magnet with a deep groove cut on a surface, whose shape is relatively complex. Therefore, magnetic fields generated on the surface are not evenly distributed, while a back-bias magnetic block magnetized in the Z-axis direction can be used as an InSb-based Z-axis sensor back-bias magnet, which has a relatively simple structure.

3) Compared with the GMR and TMR sensors, the Hall effect sensor has relatively low magnetic field sensitivity, poor stability (sensitivity, offset and resistance), and poor repeatability (it is difficult to control the change in the offset and the sensitivity).

SUMMARY OF THE INVENTION

With respect to the existing problems above, the present invention proposes a magnetoresistive Z-axis gradiometer chip, which, in combination with a standard manufacturing process of GMR and TMR sensors and advantages of a Z-axis sensor back-bias magnet, successfully solves the shortcomings of the above problems, enabling the measurement of the gradient of the Z-axis magnetic field by using magnetoresistive sensors with in-plane sensing axes, and has several advantages relative to the Hall sensor, including smaller size, lower power consumption, and higher magnetic field sensitivity.

The magnetoresistive Z-axis gradient sensor chip proposed in the present invention is used to detect the gradient in the XY plane of a component of a Z-axis magnetic field generated by a magnetic medium; the magnetoresistive Z-axis gradient sensor chip includes a Si substrate, magnetoresistive sensor units located on the Si substrate and electrically interconnected into a full bridge gradiometer or half bridge gradiometer, and two or two groups of flux guide devices located on the Si substrate; the magnetoresistive sensor units are located above or below the flux guide devices, and have a sensing direction parallel to the surface of the Si substrate, and the flux guide devices are used to convert the component of the Z-axis magnetic field generated by the magnetic medium into a sensing direction along the magnetoresistive sensing units; and each group of flux guide devices includes at least two flux guide devices, the two or two groups of flux guide devices are spaced apart by a distance Lg, and opposite bridge arms in the full bridge gradiometer or half bridge gradiometer are spaced apart by a distance Lg.

Preferably, the magnetoresistive sensor units are GMR and/or TMR sensor units.

Preferably, the flux guide devices are a soft magnetic alloy consisting of one or more elements selected from Co, Fe and Ni.

Preferably, the flux guide devices are elongated, and have a major axis along a Y-axis direction and a minor axis along an X-axis direction, and a length Ly thereof is greater than a width Lx and is also greater than a thickness Lz.

Preferably, when a vertical distance from the magnetoresistive sensor unit to a Y-axis center line of the corresponding flux guide device is less than or equal to ⅓*Lx, a working range of the magnetic field of the magnetoresistive sensor unit can be increased.

Preferably, the greater the vertical distance from the position of the magnetoresistive sensor unit to the Y-axis center line is, or the greater the thickness Lz of the flux guide device is, or the smaller the width Lx of the flux guide device is, the higher the magnetic field sensitivity of the magnetoresistive sensor unit is.

Preferably, the magnetoresistive Z-axis gradient sensor chip includes two of the flux guide devices which are arranged into an array of two rows and one column, wherein the row direction thereof is the Y-axis direction, the column direction is the X-axis direction, and the row spacing Lg corresponds to a gradient feature distance.

Preferably, two bridge arms in the half bridge gradiometer are corresponding to the two flux guide devices, respectively, the two bridge arms are located at the same position on the same side of the Y-axis center line of the corresponding flux guide device, and the magnetoresistive sensor units on the two bridge arms have the same sensing direction.

Preferably, two half bridges in the full bridge gradiometer are corresponding to the two flux guide devices, respectively, two bridge arms of each of the half bridges are symmetrically distributed on two sides of the Y-axis center line of the corresponding flux guide device, two bridge arms connected to the same power supply electrode are located at the same position on the same side of the Y-axis center line of the corresponding flux guide device, and the magnetoresistive sensor units in the full bridge gradiometer have the same sensing direction.

Preferably, two bridge arms in either of two half bridges of the full bridge gradiometer are located at the same position on the same side of the Y-axis center lines of two flux guide devices, respectively, two bridge arms connected to the same power supply electrode are corresponding to the same flux guide device and symmetrically distributed on two sides of the Y-axis center line of the flux guide device, and the magnetoresistive sensor units in the full bridge gradiometer have the same sensing direction.

Preferably, each group of flux guide devices includes 2*N (N>1) flux guide devices, the two groups of flux guide devices form an array of two rows and one column, wherein the row direction is along the Y-axis direction, and the column direction is along the X-axis direction; each group of flux guide devices forms an array of N rows and one column, wherein the row direction is along the Y-axis direction, and the column direction is along the X-axis direction; a row spacing Ls between flux guide devices in each group is much less than Lg.

Preferably, magnetoresistive sensor units on two bridge arms of the half bridge gradiometer are corresponding to N flux guide devices in the two groups of flux guide devices, respectively, the magnetoresistive sensor units on the two bridge arms are located at the same position on the same side of the Y-axis center line of the corresponding flux guide device, and the magnetoresistive sensor units have the same sensing direction.

Preferably, magnetoresistive sensor units of two half bridges in the full bridge gradiometer are corresponding to N flux guide devices in the two groups of flux guide devices, respectively, magnetoresistive sensor units of two bridge arms of each of the half bridges are symmetrically distributed on two sides of the Y-axis center line of the corresponding flux guide device, magnetoresistive sensor units of two bridge arms connected to the same power supply electrode are corresponding to N flux guide devices in the two groups of flux guide devices, respectively and are located at the same position on the same side of the Y-axis center line of the corresponding flux guide device, and the magnetoresistive sensor units in the full bridge gradiometer have the same sensing direction.

Preferably, magnetoresistive sensor units of two bridge arms in either of two half bridges of the full bridge gradiometer are corresponding to N flux guide devices in the two groups of flux guide devices, respectively and are located at the same position on the same side of the Y-axis center line of the corresponding flux guide device, magnetoresistive sensor units of two bridge arms connected to the same power supply electrode are corresponding to N flux guide devices in the same group of flux guide devices and symmetrically distributed on two sides of the Y-axis center line of the corresponding flux guide device, and the magnetoresistive sensor units in the full bridge gradiometer have the same sensing direction.

Preferably, each of the bridge arms has the same number of magnetoresistive sensor units, the magnetoresistive sensor units are electrically interconnected into a two-port structure by series connection, parallel connection or a combination of series connection and parallel connection, and the bridge arms all have the same electrical interconnection structure.

Preferably, the magnetoresistive Z-axis gradient sensor chip is electrically connected to a PCB by wire bonding.

Preferably, the magnetoresistive Z-axis gradient sensor chip is electrically connected to a PCB by Through Silicon Vias (TSV).

Preferably, the magnetoresistive Z-axis gradient sensor chip is mounted onto a PCB, for detecting a component of a Z-axis magnetic field generated by a permanent magnet magnetic medium, the magnetoresistive Z-axis gradient sensor chip is designed to have high magnetic field sensitivity and a saturated magnetic field higher than the Z-axis magnetic field generated by the permanent magnet magnetic medium.

Preferably, the magnetoresistive Z-axis gradient sensor chip is mounted onto a PCB, the back of the PCB is provided with a permanent magnet block to generate a magnetic field perpendicular to the magnetoresistive Z-axis gradient sensor chip, and the magnetoresistive Z-axis gradient sensor chip is designed to have a saturated magnetic field greater than a magnetic field generated by the permanent magnet.

Preferably, the magnetoresistive Z-axis gradient sensor chip is mounted onto a PCB, the back of the PCB is provided with a permanent magnet for generating a magnetic field perpendicular to the magnetoresistive Z-axis gradient sensor chip, the PCB is placed in a casing, the casing includes a mounting bracket and a pin electrode located at the back, the PCB and the magnetoresistive Z-axis gradient sensor chip are located in the mounting bracket, and the magnetoresistive Z-axis gradient sensor chip is designed to have a saturated magnetic field higher than a magnetic field of the permanent magnet and have high magnetic field sensitivity.

Preferably, the sensing direction of the magnetoresistive sensor units is the X-axis direction.

BRIEF DESCRIPTION OF THE DRAWINGS

In order to describe the technical solutions in technologies of embodiments of the present invention more clearly, the accompanying drawings to be used in the descriptions about the technologies of the embodiments are briefly introduced in the following. Apparently, the accompanying drawings in the following descriptions are merely some embodiments of the present invention, and those of ordinary skill in the art can also derive other accompanying drawings from these accompanying drawings without making creative efforts.

DETAILED DESCRIPTION

The present invention is described below in detail with reference to the accompanying drawings and in combination with embodiments.

First Embodiment

Figure 1:
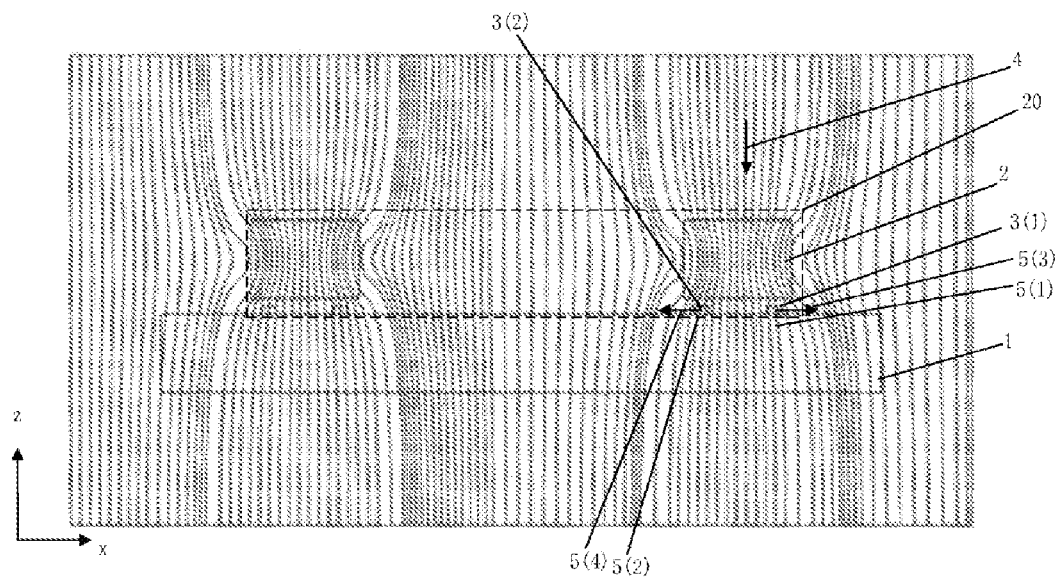
FIG. 1 is a diagram of a magnetoresistive Z-axis gradient sensor chip and the principle of measurement of a Z magnetic field thereof.

FIG. 1 is a schematic diagram of a magnetoresistive Z-axis gradiometer chip, including a Si substrate 1 and a magnetoresistive Z-axis sensor 20. The magnetoresistive Z-axis sensor 20 is located on the Si substrate 1. The magnetoresistive Z-axis sensor includes two or two groups of multiple flux guide devices 2 and magnetoresistive units 3 (which include 3(1) or 3(2) in the figure). The magnetoresistive units 3 are located above or below the flux guide devices 2. For simplification, this figure only shows the situation where the magnetoresistive units 3 are located below the flux guide devices 2, and actually the situation where the magnetoresistive units 3 are located above the flux guide devices 2 is also included. The magnetoresistive units 3 are electrically connected into a half bridge or full bridge structure gradiometer. FIG. 1 further shows the principle of measurement of a Z-axis magnetic field. After the Z-axis magnetic field 4 passes through the flux guide devices 2, as the flux guide devices 2 are made of a high-permeability soft magnetic alloy material, including soft magnetic alloy materials consisting of Ni, Fe, Co and other elements, a magnetic field 5 (1) or 5 (2) deflects at a position near the magnetoresistive units 3 (1) or 3 (2) close to an upper surface or a lower surface of the flux guide devices 2, and magnetic field components 5 (3) and 5 (4) parallel to the substrate emerge, which can thus be detected by the magnetoresistive units 3 (1) or 3 (2) having in-plane magnetic field sensitivity.

Figure 2:
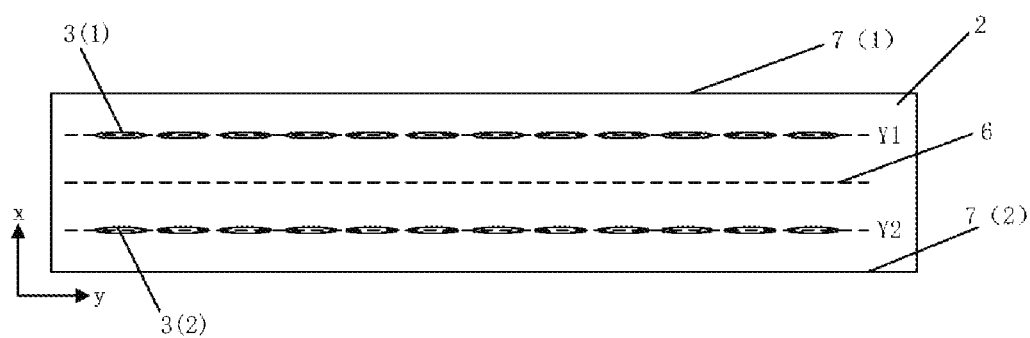
FIG. 2 is a diagram of positions of flux guide devices and magnetoresistive units.

FIG. 2 is a diagram of positions of the magnetoresistive units 3 (1) or 3 (2) and the upper surface or lower surface of the flux guide devices 2. The flux guide devices 2 are elongated, and have a major axis long a Y-axis direction and a minor axis along an X-axis direction, the magnetoresistive units are located at a position Y1 or Y2 between a Y-axis edge 7 (1) or 7 (2) and a Y-axis center line 6, and Y1 and Y2 are symmetric about the Y-axis center line 6. It can also be seen from FIG. 1 that, after the Z-axis magnetic field 4 passes through the flux guide devices 2, components 5 (4) and 5 (3) of the X-axis magnetic field at the positions Y1 and Y2 are in opposite directions.

The magnetoresistive units 3 are GMR and/or TMR sensor units, the magnetic field sensing direction thereof is the X-axis direction, and the magnetoresistive units 3 are electrically connected into a full bridge or half bridge gradiometer. It should be noted that the magnetoresistive units being located above or below the flux guide devices in the present invention refers to that the magnetoresistive units are located vertically above or below a range within respective edges of the flux guide devices.

Second Embodiment

Figure 3:
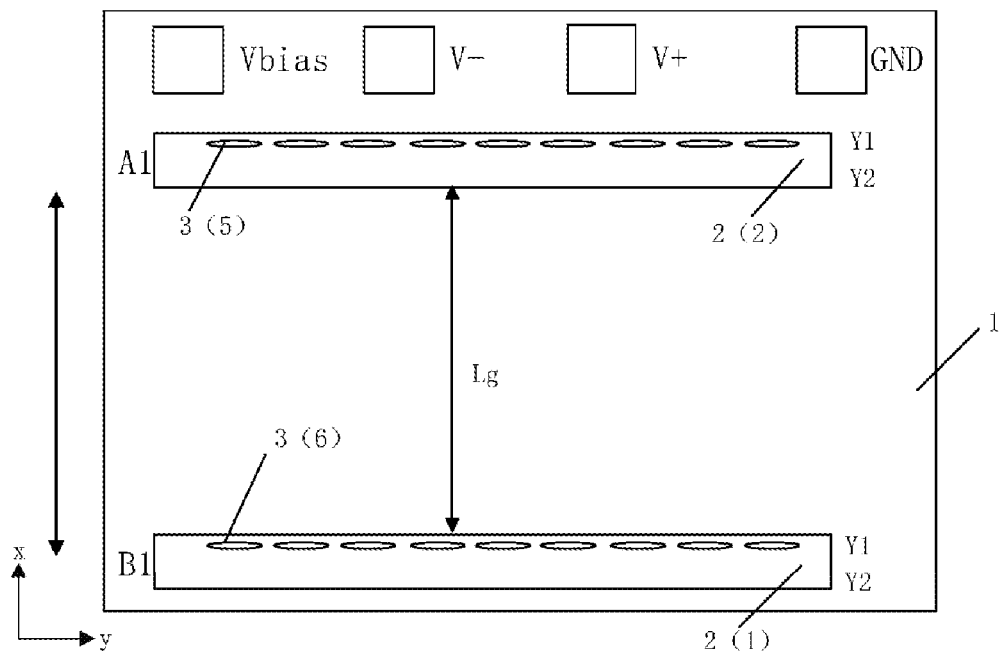
FIG. 3 is a schematic structural diagram of a half-bridge-structure magnetoresistive Z-axis gradient sensor chip with dual flux guide devices.
Figure 4:
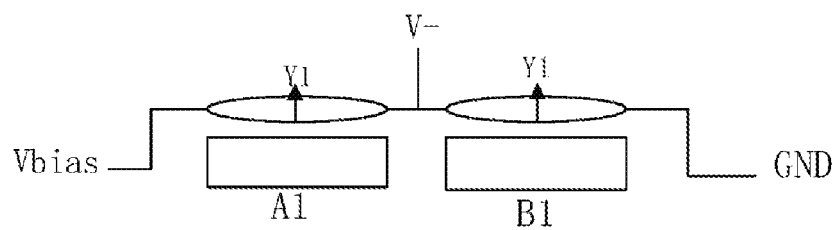
FIG. 4 is a schematic diagram of electrical connections between magnetoresistive units of the half-bridge-structure magnetoresistive Z-axis gradient sensor chip with dual flux guide devices.

FIG. 3 and FIG. 4 are diagrams of another type of magnetoresistive Z-axis half bridge gradient sensor chip and electrical connections thereof, in which magnetoresistive units 3 (5) and 3 (6) on two bridge arms of a half bridge are located in the flux guide devices A1 and B1, respectively and occupy the same position: magnetoresistive units 3 (5) and 3 (6) are located at Y1 or Y2. For ease of description, FIG. 3 and FIG. 4 only show the situation where they are located at Y1, and they have the same magnetic field sensing direction. In this case, a half bridge output signal may be calculated in the following manner:

After a Z-axis magnetic field HZ passes through the flux guide devices, an X-axis magnetic field HX is obtained, and a correlation between HZ and HX is:

$$HX1 = HZ1 * SXZ \tag{1}$$

$$HX2 = HZ2 * SXZ \tag{2}$$

where SXZ is a magnetic field conversion parameter of the flux guide devices, which is related to the geometric structure and material property of the flux guide devices, HZ1 and HZ2 are components of the Z-axis magnetic field corresponding to the flux guide devices A1 and B1, respectively, and HX1 and HX2 are sensing-axis magnetic field components at the magnetoresistive sensor units after passing through the flux guide devices A1 and B1, respectively.

The final half bridge output signal is $$V\text{out} = HX1 * S - HX2 * S = SXZ * HZ1 * S - SXZ * HZ2 * S$$

$$= SXZ * S * (HZ1 - HZ2) \tag{3}$$

where S is sensitivity.

The gradient of the Z-axis magnetic field measured by the Z-axis magnetoresistive gradient sensor chip is:

$$\text{Gradient } HZ = (HZ1 - HZ2)/Lg = V\text{out}/(Lg * SXZ * S) \tag{4}$$

Thus, the gradient of the Z-axis magnetic field is directly proportional to the output signal of the magnetoresistive Z-axis half bridge gradient sensor chip.

The Lg refers to a distance between two or two groups of flux guide devices, also referred to as a gradient feature distance.

Third Embodiment

Figure 5:
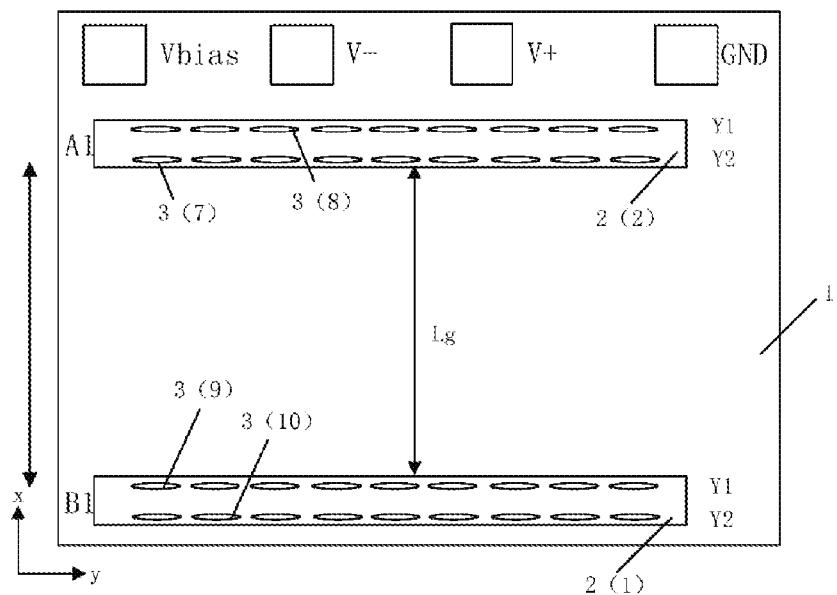
FIG. 5 is a schematic structural diagram of a full-bridge-structure magnetoresistive Z-axis gradient sensor chip with dual flux guide devices.
Figure 6:
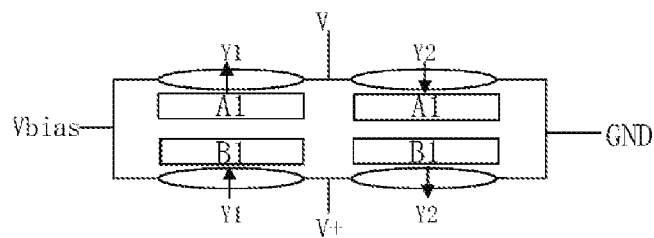
FIG. 6 is a first schematic diagram of electrical connections between magnetoresistive units of the full-bridge-structure magnetoresistive Z-axis gradient sensor chip with dual flux guide devices.
Figure 7:
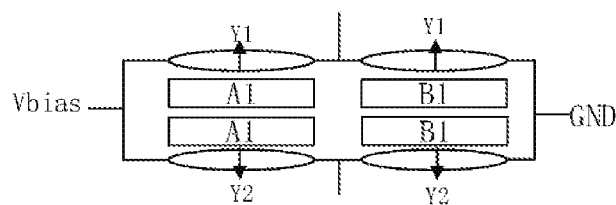
FIG. 7 is a second schematic diagram of electrical connections between magnetoresistive units of the full-bridge-structure magnetoresistive Z-axis gradient sensor chip with dual flux guide devices.

FIGS. 5-7 are a schematic structural diagram of a full-bridge-structure gradient sensor chip and diagrams of five types of electrical connections between magnetoresistive units corresponding thereto. In FIG. 5, the respective positions Y1 and Y2 corresponding to the flux guide devices A1 and B1 are occupied by magnetoresistive units 3(7)-3(10) corresponding to four bridge arms of the full bridge, respectively. In FIG. 6, two half bridges of the full bridge are corresponding to the flux guide devices A1 and B1, respectively. The magnetoresistive units at the positions Y1 and Y2 of each flux guide device have the same magnetic field sensing direction, and magnetoresistive units of two bridge arms connected to an electrode have the same magnetic field sensing direction. The output signal of the full bridge structure gradient sensor chip shown in FIG. 5 is as shown by the formulas (5)-(7), and the measured gradient of the Z-axis magnetic field is as shown by the formula (8):

$$V-=HX1*S-(-HX1)*S=2*HX1*S \quad (5)$$

$$V+=HX2*S-(-HX2)*S=2*HX2*S \quad (6)$$

$$V\text{out}=V+-V-=2*SXZ*S*(HZ1-HZ2) \quad (7)$$

$$\text{Gradient } HZ=(HZ1-HZ2)/Lg=V\text{out}/(2*Lg*SXZ*S) \quad (8)$$

As shown in FIG. 7, two bridge arms corresponding to two half bridges of the full bridge are corresponding to the same position Y1 or Y2 in the two flux guide devices A1 and B1, respectively and have the same magnetic field sensing direction, and magnetoresistive units of the two bridge arms connected to the same electrode are located at different positions in the same flux guide device. The output signal of the full bridge structure gradient sensor chip shown in FIG. 7 is as shown by the formulas (9)-(11), and the measured gradient of the Z-axis magnetic field is as shown by the formula (12):

$$V-=HX1*S-HX2*S \quad (9)$$

$$V+=-HX1*S-(-HX2)*S \quad (10)$$

$$V\text{out}=V+-V-=-2*SXZ*S*(HZ2-HZ1) \quad (11)$$

$$\text{Gradient } HZ=(HZ1-HZ2)/Lg=-V\text{out}/(2*Lg*SXZ*S) \quad (12)$$

Fourth Embodiment

FIGS. 8-13 are diagrams of a Z-axis gradient sensor with multiple flux guide devices and electrical connections thereof. The number of the multiple flux guide devices is 2*N (N is an integer greater than 1); the multiple flux guide devices are classified as two groups, that is, group A and group B, are corresponding to 2 (11) and 2 (12), and are arranged into an array of two rows and one column; the row direction thereof is the Y-axis direction, the column direction is the X-axis direction, and a row spacing between the two groups is Lg. In addition, the group A and the group B each include N flux guide devices, in which the N flux guide devices of the group A are numbered 2(11)-1 to 2(11)-N respectively, the N flux guide devices of the group B are numbered 2 (12)-1 to 2(12)-N respectively; each group is arranged into a structure of N rows and one column, and a distance between rows is a gradient feature group spacing Ls, wherein Ls is much less than Lg, and similarly, each flux guide device is corresponding to two positions Y1 and Y2.

Similar to the Z-axis gradient sensor chip of the two-flux guide device structure, structures of the Z-axis gradient sensor with multiple groups of flux guide devices may also be classified into two types of structures, i.e., half bridge and full bridge, which are one-to-one corresponding to those of the Z-axis gradient sensor chip with dual flux guide devices. The difference lies in that, in the Z-axis gradient sensor chip with dual flux guide devices, each bridge arm is corresponding to the position Y1 or Y2 of the flux guide device A or B, and for the Z-axis gradient sensor chip with multiple flux guide devices, each bridge arm is corresponding to the position Y1 or Y2 corresponding to N flux guide devices A1-AN or B1-BN in the group A or group B.

Figure 8:
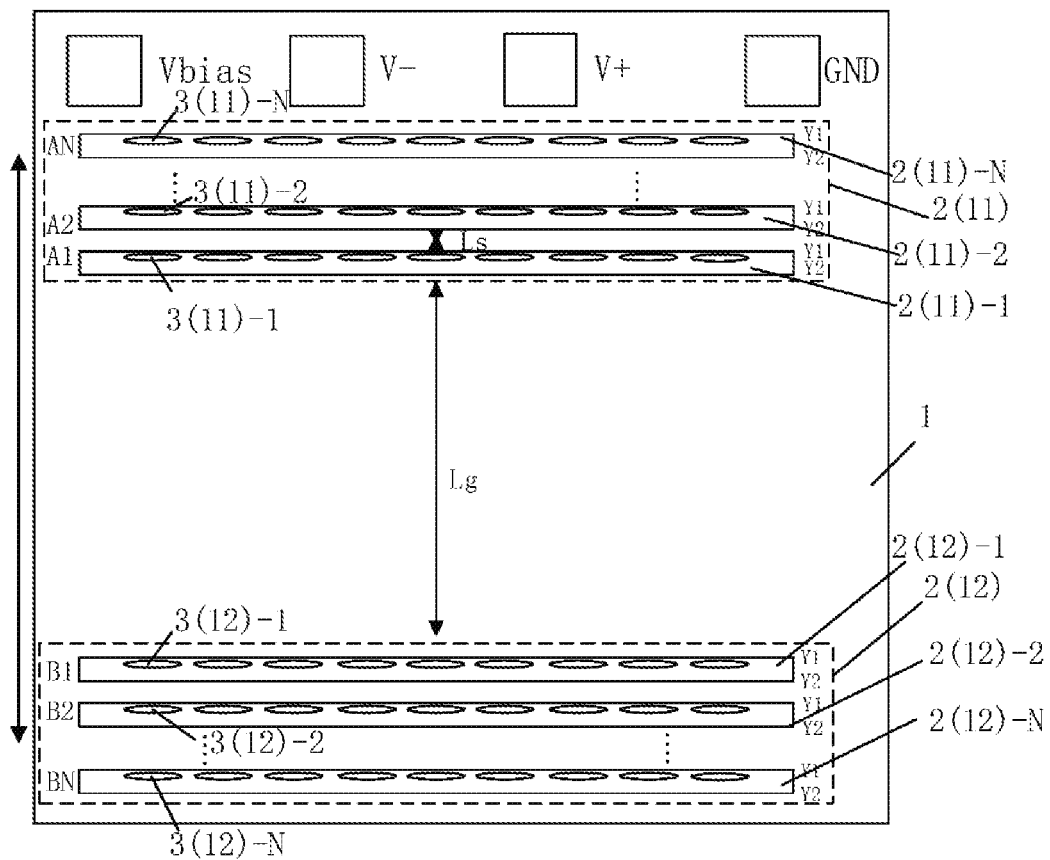
FIG. 8 is a schematic structural diagram of a half-bridge-structure magnetoresistive Z-axis gradient sensor chip with multiple flux guide devices.
Figure 9:
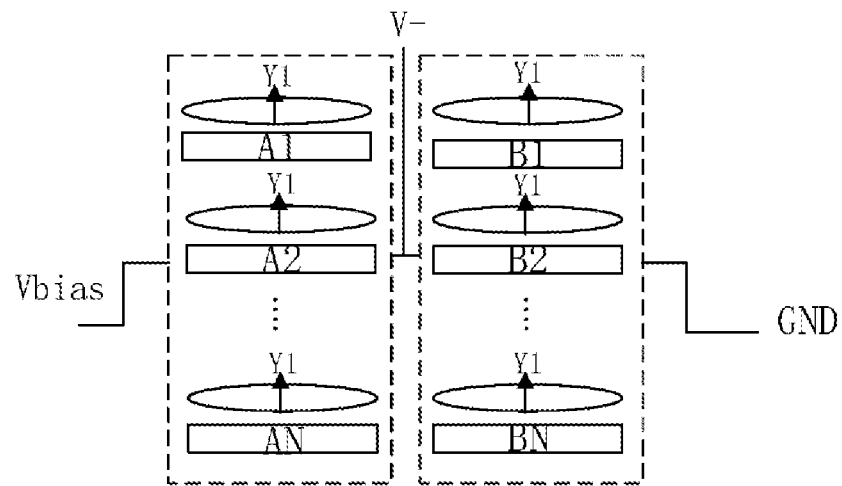
FIG. 9 is a schematic diagram of electrical connections between magnetoresistive units of the half-bridge-structure magnetoresistive Z-axis gradient sensor chip with multiple flux guide devices.

FIGS. 8-9 are diagrams of a half-bridge-structure Z-axis gradient sensor with multiple flux guide devices and electrical connections thereof, in which magnetoresistive units corresponding to two bridge arms that form the half bridge are corresponding to the same position Y1 or Y2 in N flux guide devices of the group A and N flux guide devices of the group B, respectively, and have the same magnetic field sensing direction.

Similarly, the Z-axis gradient sensor with multiple flux guide devices also has two types of full bridge structures.

Figure 10:
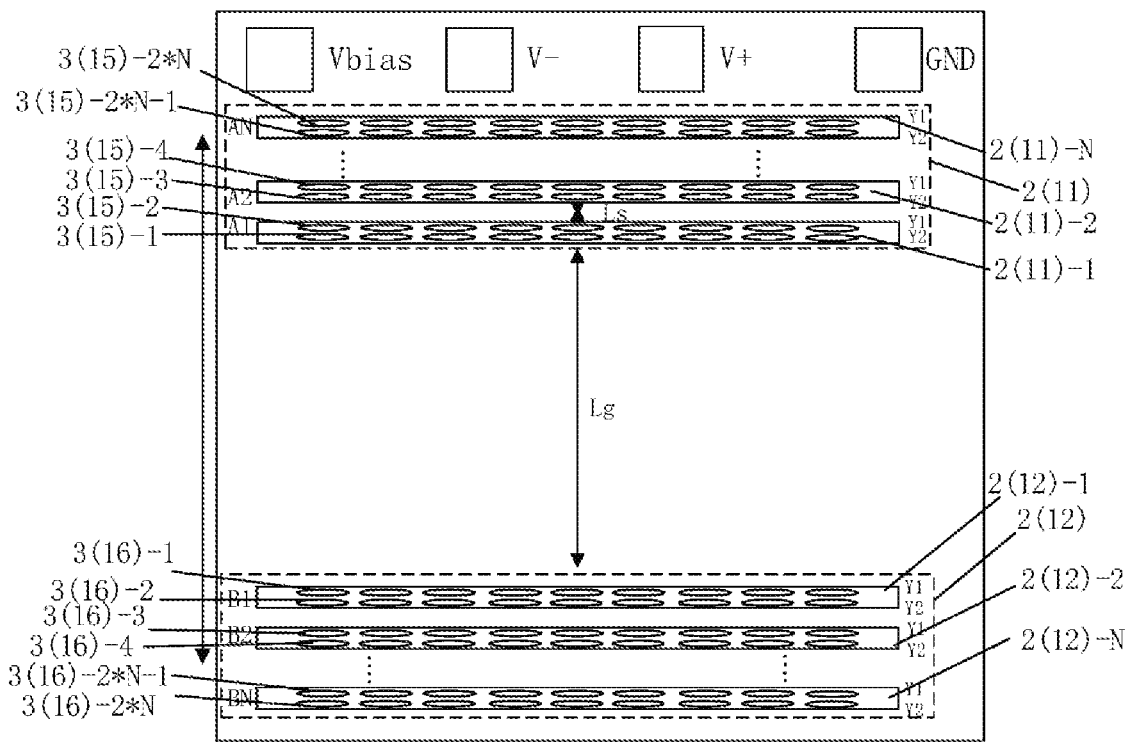
FIG. 10 is a schematic structural diagram of a full-bridge-structure magnetoresistive Z-axis gradient sensor chip with multiple flux guide devices.
Figure 11:
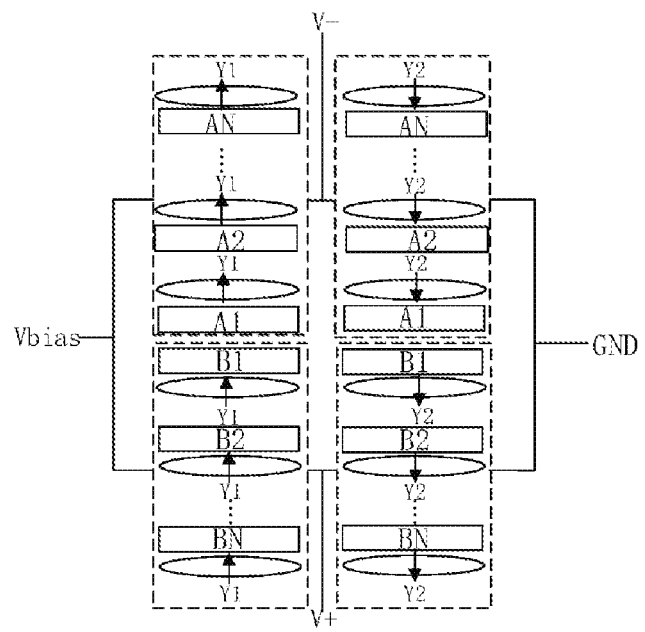
FIG. 11 is a first schematic structural diagram of electrical connections between magnetoresistive units of the full-bridge-structure magnetoresistive Z-axis gradient sensor chip with multiple flux guide devices.
Figure 12:
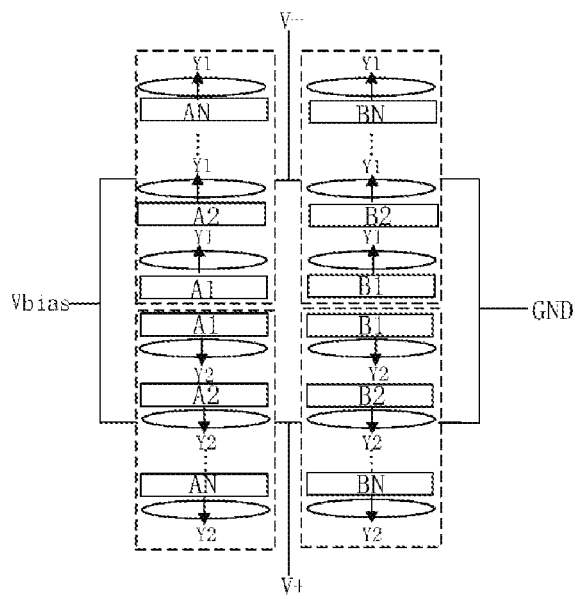
FIG. 12 is a second schematic structural diagram of electrical connections between magnetoresistive units of the full-bridge-structure magnetoresistive Z-axis gradient sensor chip with multiple flux guide devices.
Figure 13:
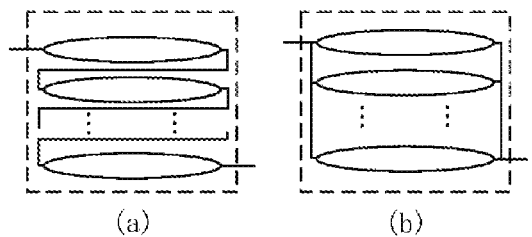
FIG. 13 is a diagram of connections between magnetoresistive units on a bridge arm in the full-bridge-structure magnetoresistive Z-axis gradient sensor chip with multiple flux guide devices, where a represents series connection; and b represents parallel connection.

FIGS. 10-12 are diagrams of a full-bridge-structure Z-axis gradient sensor with multiple flux guide devices and a structure thereof. Four bridge arms forming a full bridge in FIG. 10 are located at two respective positions Y1 and Y2 corresponding to N flux guide devices of the group A and N flux guide devices of the group B.

The first type of connections between magnetoresistive units are as shown in FIG. 11, two half bridges of the full bridge are corresponding to the position Y1/Y2 of N flux guide devices of the group A or the position Y1/Y2 of N flux guide devices of the group B, respectively, the magnetoresistive units at the position Y1 or Y2 have the same magnetic field sensing directions, and two bridge arms connected to the same electrode are located at the same position Y1 or Y2 in different flux guide devices of A/B or B/A.

The second type of connections between magnetoresistive units are as shown in FIG. 12, bridge arms corresponding to either of two half bridges of the full bridge are corresponding to the same position Y1 or Y2 of N flux guide devices in two groups of flux guide devices, respectively, and have the same magnetic field sensing direction, and two bridge arms connected to the same electrode are located at different positions in the same group of flux guide devices.

The magnetoresistive Z-axis gradient sensor chip with dual flux guide devices or multiple flux guide devices, in the full bridge or half bridge structure, has multiple magnetoresistive units corresponding to the position Y1 or Y2 of the same flux guide device. The magnetoresistive units may form a series structure as in FIG. 13(*a*) and may also form a parallel structure as in FIG. 13(*b*), or form a series and parallel combined structure. In the magnetoresistive Z-axis gradient sensor with dual flux guide devices, each bridge arm is corresponding to the position Y1 or Y2 of one flux guide device. Therefore, the magnetoresistive units finally form a two-port structure in the position Y1 or Y2 by series connection, parallel connection or a combination of series connection and parallel connection, to form a bridge arm.

For a full bridge or half bridge structure with multiple flux guide devices, the bridge arms are corresponding to the same position X or Y of N flux guide devices in the group A or group B. Therefore, in addition to series connection, parallel connection or a combination of series connection and parallel connection in the position X or Y, series connection, parallel connection or a combination of series connection and parallel connection between the N flux guide devices is further included, to finally form a two-port structure and make up a bridge arm.

In addition, for the Z-axis gradient sensor chip of a half bridge structure or a full bridge structure, each bridge arm has the same number of magnetoresistive units, and the series and parallel electrical connection structures thereof in the flux guide devices are also the same.

Fifth Embodiment

Figure 14:
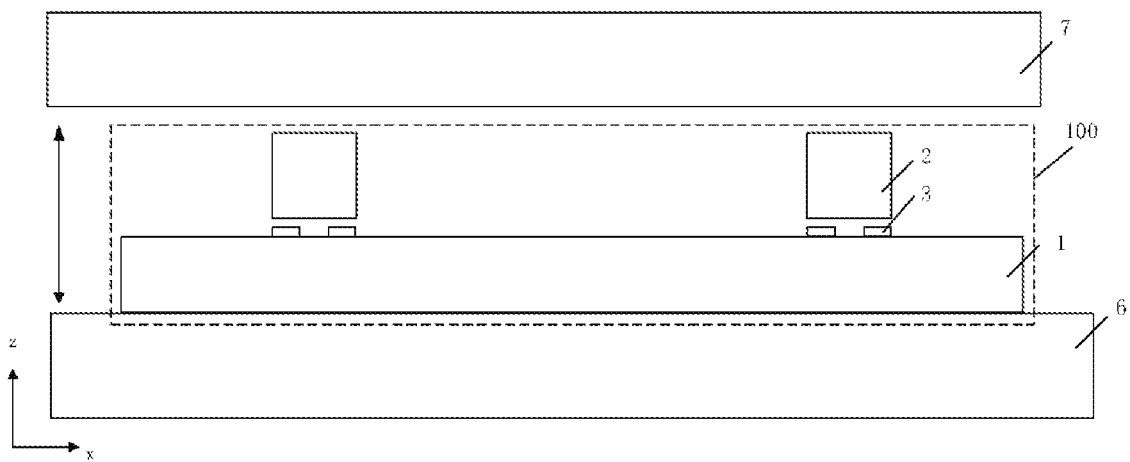
FIG. 14 is a schematic diagram showing that a magnetoresistive Z-axis gradient sensor chip is applied to detection of a hard magnetic image.

FIG. 14 is a structural diagram showing that a magnetoresistive Z-axis sensor chip is applied to identification of a hard magnetic image, which includes a PCB 6 and a magnetoresistive Z-axis gradient sensor chip 100. The magnetoresistive Z-axis gradient sensor chip 100 is located on the PCB 6, and a hard magnetic image 7 is located on a magnetic image detection surface parallel to the surface of the chip, and a component of a Z-axis magnetic field of the hard magnetic image 7 is detected by the magnetoresistive Z-axis gradient sensor chip 100, so as to identify the magnetic image 7. In this case, the magnetoresistive Z-axis gradient sensor chip is required to have high magnetic field sensitivity, and the measuring range of the Z-axis magnetic field thereof is greater than that of the Z-axis magnetic field generated by the hard magnetic image 7.

Sixth Embodiment

Figure 15:
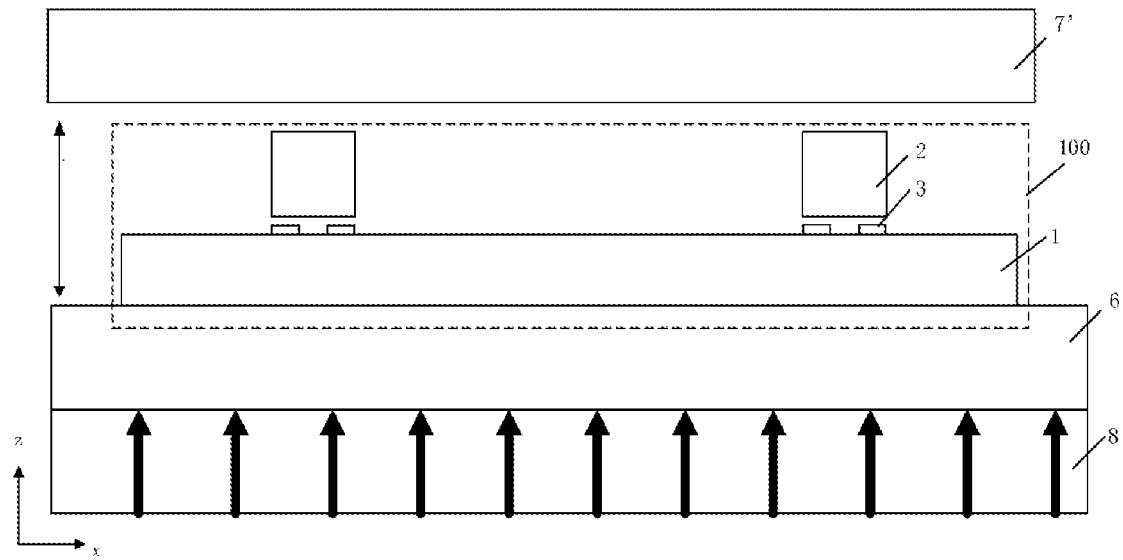
FIG. 15 is a schematic diagram showing that a magnetoresistive Z-axis gradient sensor chip is applied to a magnetic head of a soft magnetic image.

FIG. 15 is a structural diagram showing that a magnetoresistive Z-axis gradient sensor chip is applied to identification of a soft magnetic image or applied to a gear sensor, which includes a PCB 6 and a back magnetic block 8. The magnetoresistive Z-axis gradient sensor chip 100 is located on the PCB 6, and the back-bias magnetic block 8 is located at the back of the PCB 6. The magnetization direction of the back-bias magnetic block 8 is perpendicular to the PCB 6, that is, along Z-axis direction. A soft magnetic image 7' is located on a surface parallel to the magnetoresistive Z-axis sensor chip 100. In this case, the magnetoresistive Z-axis gradient sensor chip is required to have high magnetic field sensitivity, and the measuring range of the Z-axis magnetic field thereof is greater than that of the Z-axis magnetic field generated by the back-bias magnetic block 8.

Seventh Embodiment

Figure 16:
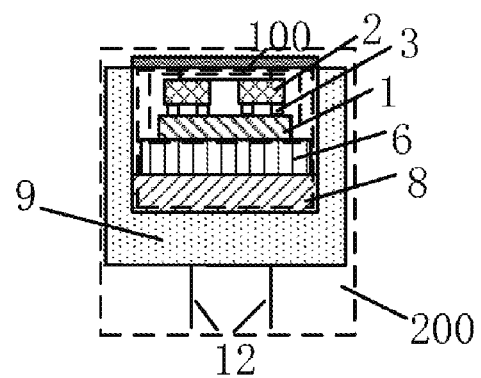
FIG. 16 is a schematic diagram of a magnetoresistive Z-axis gradient sensor chip with a mounting structure.

FIG. 16 is a schematic diagram of a mounting structure of a magnetoresistive Z-axis gradient sensor chip, which, when applied to a currency detector magnetic head, further includes a PCB 6, a back-bias magnetic block 8 and a casing 200. The magnetoresistive Z-axis gradient sensor chip 100 is mounted onto the PCB 6, the back-bias magnetic block 8 is located at the back of the PCB 6, the PCB 6 and the magnetoresistive Z-axis gradient sensor chip 100 are mounted in the casing 200, the casing 200 includes a mounting bracket 9 and a pin electrode 12, and the magnetoresistive Z-axis gradient sensor chip 100 is designed to have a saturated magnetic field higher than the Z-axis magnetic field generated by the back-bias magnetic block 8 and high magnetic field sensitivity.

The above descriptions are merely preferred embodiments of the present invention, and are not intended to limit the present invention. For those skilled in the art, the present invention may have various modifications and changes. Any modification, equivalent replacement, improvement or the like made without departing from the spirit and principle of the present invention shall all fall within the protection scope of the present invention.

The invention claimed is:

1. A magnetoresistive Z-axis gradient sensor chip for detecting a gradient in an XY plane of a Z-axis magnetic field generated by a magnetic medium where the gradient in the XY plane of the Z-axis magnetic field represents a difference for the Z-axis field in the XY plane at a gradient feature distance in an X-axis direction, wherein the magnetoresistive Z-axis gradient sensor chip comprises:
    a silicon (Si) substrate having a surface in the XY plane and perpendicular to the Z-axis magnetic field,
    a magnetoresistive Z axis sensor on the surface of the Si substrate, the magnetoresistive Z axis sensor including a first region and a second region, the magnetoresistive Z-axis sensor including magnetoresistive sensor units and flux guide devices, wherein each of the magnetoresistive sensor units on the surface of the Si substrate is fabricated with a pin layer orientation in either a positive X-axis direction to cause the sensor unit to have a positive X-axis sensing direction or orientated in a negative X-axis direction to cause the sensor unit to have a negative X-axis sensing direction, wherein the flux guide devices comprise a soft magnetic material and are separate structures that are not interconnected by the soft magnetic material, wherein each of the flux guide devices has an elongated shape with a central, major axis in a Y-axis direction and a minor axis in the X-axis direction, and wherein each of the flux guide devices is configured to convert the Z-axis magnetic field into X-axis components in opposite X-axis directions, and wherein each of the flux guide devices corresponds to a set of the magnetoresistive sensor units positioned to sense the X-axis components of the converted Z-axis magnetic field, wherein the corresponding set of the magnetoresistive sensor units include first and second subsets of magnetoresistive sensor units symmetrically positioned across a plane in the Y-axis direction and Z-axis-direction that passes through the central, major axis, and the first and second subsets of magnetoresistive sensor units have opposite pin layer orientations;
    wherein the positive and negative X-axis sensing directions of the magnetoresistive sensor units are parallel to the surface of the Si substrate and perpendicular to the Y-axis direction, and wherein corresponding ones of the flux guide devices are above or below corresponding ones of the magnetoresistive sensor units and are configured to convert the Z-axis magnetic field into the opposite X-axis directions for sensing by the corresponding ones of the magnetoresistive sensing units;
    wherein the flux guide devices are separated into two sets of respective one or more flux guide devices, wherein the two sets include a first set of the one or more flux guide devices in the first region and a second set of the one or more flux guide devices in the second region, wherein the two sets are symmetrically positioned about a Y-axis line of symmetry between the two sets;
    wherein the magnetoresistive sensor units are electrically interconnected into a full-bridge gradiometer having four full-bridge arms, wherein each of the full-bridge arms in the full-bridge gradiometer includes a linear arrangement of magnetoresistive sensor units extending in the Y-axis direction,
    wherein the four full-bridge arms include a first full-bridge arm connected to a second full-bridge arm at a first node, the second full-bridge arm connected to a third full-bridge arm at a second node, the third full-bridge arm connected to a fourth full-bridge arm at a third node, and the fourth full-bridge arm connected to the first full-bridge arm at a fourth node, and wherein opposite ones of the four full-bridge arms are not connected at one of the first, second, third and fourth nodes, are respectively positioned above or below the first set of one or more flux guide devices in the first region and the second set of one or more flux guide devices in the second region and are separated in the X-axis direction by the gradient feature distance, wherein the opposite ones of the four full-bridge arms include the first and second subsets of magnetoresistive sensor units, respectively, having opposite pin layer orientations.

2. The magnetoresistive Z-axis gradient sensor chip according to claim 1, wherein the magnetoresistive sensor units are GMR and/or TMR sensor units.

3. The magnetoresistive Z-axis gradient sensor chip according to claim 1, wherein the flux guide devices are a soft ferromagnetic alloy consisting of one or more elements selected from Co, Fe and Ni.

4. The magnetoresistive Z-axis gradient sensor chip according to claim 1, wherein each of the flux guide devices has a length Ly, a width Lx and a thickness Lz, and the length Ly is greater than the width Lx and the thickness Lz.

5. The magnetoresistive Z-axis gradient sensor chip according to claim 4, wherein a vertical distance from the corresponding ones of the magnetoresistive sensor units to the central, major axis of the corresponding ones of the flux guide devices is less than or equal to ⅓ *Lx.

6. The magnetoresistive Z-axis gradient sensor chip according to claim 4, wherein the flux guide devices comprise two flux guide devices arranged into an array of two rows and one column, wherein a row direction for the two rows is the Y-axis direction and a column direction for the column is the X-axis direction.

7. The magnetoresistive Z-axis gradient sensor chip according to claim 4, wherein each of the two sets include four or more flux guide devices arranged in an array of four or more rows and one column, wherein the row direction is along the Y-axis direction and the column direction is along the X-axis direction; and wherein a row spacing Ls between flux guide devices in each of the two sets is less than the gradient feature distance.

8. The magnetoresistive Z-axis gradient sensor chip according to claim 1, wherein each of the full-bridge arms has a two port structure to provide an electrical connection on each end of the respective bridge arm, and has the same number of magnetoresistive sensor units electrically interconnected within the two-port structure by series connection, parallel connection or a combination of series connection and parallel connection, and the bridge arms have the same electrical interconnection structure.

9. A system including the magnetoresistive Z-axis gradient sensor chip according to claim 1 and a PCB, wherein the magnetoresistive Z-axis gradient sensor chip is electrically connected to the PCB by wire bonding or Through Silicon Vias (TSV).

10. A system including the magnetoresistive Z-axis gradient sensor chip according to claim 1 and a PCB, wherein the Z-axis magnetic field is generated by a permanent magnet magnetic medium which is the magnetic medium, wherein the magnetoresistive Z-axis gradient sensor chip is mounted onto the PCB for detecting a component of the Z-axis magnetic field generated by the permanent magnet magnetic medium, and wherein the Z-axis magnetic field generated by the permanent magnet magnetic medium does not saturate the magnetoresistive Z-axis gradient sensor chip.

11. A system including the magnetoresistive Z-axis gradient sensor chip according to claim 1 and a PCB having a back, wherein the Z-axis magnetic field is generated by a permanent magnet which is the magnetic medium, wherein the magnetoresistive Z-axis gradient sensor chip is mounted onto the PCB, wherein the back of the PCB is provided with the permanent magnet, and wherein the Z-axis magnetic field generated by the permanent magnet does not saturate the magnetoresistive Z-axis gradient sensor chip.

12. A system including the magnetoresistive Z-axis gradient sensor chip according to claim 1 and a PCB having a back, wherein the Z-axis magnetic field is generated by a permanent magnet which is the magnetic medium, wherein the magnetoresistive Z-axis gradient sensor chip is mounted onto the PCB, wherein the back of the PCB is provided with the permanent magnet, wherein the PCB is placed in a casing comprising a mounting bracket and a pin electrode located at the back, wherein the PCB and the magnetoresistive Z-axis gradient sensor chip are located in the mounting bracket, and wherein the Z-axis magnetic field generated by the permanent magnet does not saturate the magnetoresistive Z-axis gradient sensor chip.

13. The magnetoresistive Z-axis gradient sensor chip according to claim 1, wherein the full-bridge gradiometer includes two half-bridge gradiometers where a sensing direction of the sensing directions for the magnetoresistive sensor units in one of the two half-bridge gradiometers has an opposite polarity as a sensing direction of the sensing directions for the magnetoresistive sensor units in the other of the two half-bridge gradiometers.

* * * * *